United States Patent
Zhang et al.

(10) Patent No.: US 8,405,339 B2
(45) Date of Patent: Mar. 26, 2013

(54) SYSTEM AND METHOD FOR DETECTING FAULT IN AN AC MACHINE

(75) Inventors: Pinjia Zhang, Atlanta, GA (US); Bin Lu, Kenosha, WI (US); Thomas G. Habetler, Snellville, GA (US)

(73) Assignee: Eaton Corporation, Cleveland, OH (US)

( * ) Notice: Subject to any disclaimer, the term of this patent is extended or adjusted under 35 U.S.C. 154(b) by 232 days.

(21) Appl. No.: 12/829,205

(22) Filed: Jul. 1, 2010

(65) Prior Publication Data

US 2012/0001580 A1    Jan. 5, 2012

(51) Int. Cl.
*G01R 31/02* (2006.01)

(52) U.S. Cl. ........ 318/490; 318/798; 318/806; 324/545; 324/76.77; 324/765.01; 324/76.19; 324/86; 361/23; 361/30; 361/31; 361/820; 361/775; 700/286; 340/679; 706/20; 706/912; 702/115; 702/185

(58) Field of Classification Search .................. 318/798, 318/806, 490; 324/545, 76.77, 765.01, 86, 324/76.11, 76.19; 702/57, 58, 185, 60, 115; 361/23, 30, 31, 820, 761, 775, 78; 700/286; 340/679; 706/20, 912; 257/678, 691
See application file for complete search history.

(56) References Cited

U.S. PATENT DOCUMENTS

| | | | |
|---|---|---|---|
| 4,377,784 A | | 3/1983 | Saito et al. |
| 4,761,703 A * | | 8/1988 | Kliman et al. .................. 361/23 |
| 4,808,932 A * | | 2/1989 | Schulz et al. ................. 324/545 |
| 4,851,766 A | | 7/1989 | Shiobara et al. |
| 5,049,815 A | | 9/1991 | Kliman |
| 5,521,482 A | | 5/1996 | Lang et al. |
| 5,629,870 A * | | 5/1997 | Farag et al. .................... 700/286 |
| 5,680,025 A | | 10/1997 | Bowers, III et al. |
| 5,739,698 A * | | 4/1998 | Bowers et al. ........... 324/765.01 |
| 5,742,522 A * | | 4/1998 | Yazici et al. .................. 702/185 |
| 6,308,140 B1 | | 10/2001 | Dowling et al. |
| 6,456,946 B1 | | 9/2002 | O'Gorman |
| 6,640,196 B1 * | | 10/2003 | Unsworth et al. ............. 702/115 |
| 7,081,760 B2 * | | 7/2006 | Mirafzal et al. ............... 324/545 |

OTHER PUBLICATIONS

Frank et al. "Modelling Locational Decision Making of Firms Using Multidimensional Fuzzy Decision Tables: An Illustration", Issue Date: Jun. 21, 2004, Series/Report No. Solstice, vol. XV, No. 1 ISSN: 1059-5325.*

Paul V. Goode, IEEE Transactions on Industrial Electronics, vol. 42, No. 2, Apr. 1995 139, Using a NeuralFuzzy System to Extract Heuristic, Knowledge of Incipient Faults in Induction, Motors: Part 11—Application.*

IEEE Transactions on Industry Applications, vol. 28, No. 1, Jan./Feb. 1992 165 Detection of Broken Bars in the Cage Rotor on, an Induction Machine, Nagwa M. Elkasabgy, Anthony R. Eastham, Senior Member, IEEE.*

(Continued)

*Primary Examiner* — Walter Benson
*Assistant Examiner* — Jorge Carrasquillo
(74) *Attorney, Agent, or Firm* — Ziolkowski Patent Solutions Group, SC

(57) ABSTRACT

A system and method for detecting a rotor fault condition in an AC induction machine is disclosed. The system includes a processor programmed to receive voltage and current data from an AC induction machine, generate a current frequency spectrum from the current data, and identify rotor-fault related harmonics in the current frequency spectrum. The processor is also programmed to calculate a fault severity indicator using the voltage and current data, identified rotor-fault related harmonics, and motor specifications, analyze the fault severity indicator to determine a possibility of rotor fault. The processor generates an alert based on the possibility of rotor fault.

20 Claims, 7 Drawing Sheets

OTHER PUBLICATIONS

PV Goode et al. "Using a Neural/Fuzzy System to Extract Heuristic Knowledge of Incipient Faults in Induction Motors: Part II"—Application, 1995 IEEE, pp. 139-146.*

Elkasabgy et al., "Detection of broken bars in the cage rotor on an induction machine," IEEE Transactions on Industry Applications, vol. 28, No. 1, pp. 165-171, Feb. 1992.*

Mohammed et al., "Modeling and Characterization of Induction Motor Internal Faults Using Finite-Element and Discrete Wavelet Transforms," IEEE Transactions on Magnetics, vol. 42, No. 10, pp. 3434-3436, Oct. 2006.*

Cusido et al., "Fault Detection in Induction Machines Using Power Spectral Density in Wavelet Decomposition," IEEE Transactions on Industrial Electronics, vol. 55, No. 2, pp. 633-643, Feb. 2008.*

Haji et al., "Pattern recognition—a technique for induction machines rotor broken bar detection," IEEE Transaction on Energy Conversion, vol. 16, No. 4, pp. 312-317, Dec. 2001.*

Kral et al., "Sequences of field-oriented control for the detection of faulty rotor bars in induction machines—the Vienna Monitoring Method," IEEE Transactions on Industrial Electronics, vol. 47, No. 5, pp. 1042-1050, Oct. 2000.*

Filipetti et al., "Development of Expert System Knowledge Base to On-Line Diagnosis of Rotor Electrical Faults of Induction Motors," IEEE Transactions on Industry Applications, vol. 34, pp. 92-98, 1998.

Bruzzese, "Analysis and Application of Particular Current Signatures (Symptoms) for Cage Monitoring in Nonsinusoidally Fed Motors With High Rejection to Drive Load, Inertia, and Frequency Variations," IEEE Transactions on Industrial Electronics, vol. 55, No. 12, pp. 4137-4155, Dec. 2008.

Toliyat et al., "Transient analysis of cage induction machines under stator, rotor bar and end ring faults," IEEE Transaction on Energy Conversion, vol. 10, No. 2, pp. 241-247, Jun. 1995.

Schoen et al., "Effects of time-varying loads on rotor fault detection in induction machines," IEEE Transactions on Industry Applications, vol. 31, No. 4, pp. 900-906, Jul./Aug. 1995.

Yazici et al., "An adaptive statistical time-frequency method for detection of broken bars and bearing faults in motors using stator current," IEEE Transactions on Industry Applications, vol. 35, No. 2, pp. 442-452, Mar./Apr. 1999.

Kia et al., "A High-Resolution Frequency Estimation Method for Three-Phase Induction Machine Fault Detection," IEEE Transactions on Industrial Electronics, vol. 54, No. 4, pp. 2305-2314, Aug. 2007.

Da Silva et al., "Induction Machine Broken Bar and Stator Short-Circuit Fault Diagnostics Based on Three-Phase Stator Current Envelopes," IEEE Transactions on Industrial Electronics, vol. 55, No. 3, pp. 1310-1318, Mar. 2008.

Bellini et al., "Monitoring of induction machines by maximum covariance method for frequency tracking," IEEE Transactions on Industry Applications, vol. 42, No. 1, pp. 69-78, Jan./Feb. 2006.

Hsu, "Monitoring of defects in induction motors through air-gap torque observation," IEEE Transactions on Industry Applications, vol. 31, No. 5, pp. 1016-1021, Sep./Oct. 1995.

Thomas et al., "Online cage rotor fault detection using air-gap torque spectra," IEEE Transaction on Energy Conversion, vol. 18, No. 2, pp. 265-270, Jun. 2003.

Trzynadlowski et al., "Comparative investigation of diagnostic media for induction motors: a case of rotor cage faults," IEEE Transactions on Industrial Electronics, vol. 47, No. 5, pp. 1092-1099, Oct. 2000.

Eltabach et al., "A comparison of external and internal methods of signal spectral analysis for broken rotor bars detection in induction motors," IEEE Transactions on Industrial Electronics, vol. 51, No. 1, pp. 107-121, Feb. 2004.

Didier et al., "Fault detection of broken rotor bars in induction motor using a global fault index," IEEE Transactions on Industry Applications, vol. 42, No. 1, pp. 79-88, Jan./Feb. 2006.

Bellini, "Quad Demodulation: A Time-Domain Diagnostic Method for Induction Machines," IEEE Transactions on Industry Applications, vol. 45, No. 2, pp. 712-719, Mar./Apr. 2009.

Jaksch et al., "Demodulation analysis for exact rotor faults detection under changing parameters," IEEE International Symposium on Power Electronics and Drives in Diagnostics for Electric Machines, SDEMPED 2009, pp. 1-7.

Ayhan et al., "Multiple signature processing-based fault detection schemes for broken rotor bar in induction motors," IEEE Transaction on Energy Conversion, vol. 20, No. 2, pp. 336-343, Jun. 2005.

Ayhan et al., "Multiple Discriminant Analysis and Neural-Network-Based Monolith and Partition Fault-Detection Schemes for Broken Rotor Bar in Induction Motors," IEEE Transactions on Industrial Electronics, vol. 53, No. 4, pp. 1298-1308, Aug. 2006.

Razik et al., "A Novel Monitoring of Load Level and Broken Bar Fault Severity Applied to Squirrel-Cage Induction Motors Using a Genetic Algorithm," IEEE Transactions on Industrial Electronics, vol. 56, No. 11, pp. 4615-4626, Nov. 2009.

Bellini et al., "Quantitative evaluation of induction motor broken bars by means of electrical signature analysis," IEEE Transactions on Industry Applications, vol. 37, No. 5, pp. 1248-1255, Sep./Oct. 2001.

Bellini et al., "On-field experience with online diagnosis of large induction motors cage failures using MCSA," IEEE Transactions on Industry Applications, vol. 38, No. 4, pp. 1045-1053, Jul./Aug. 2002.

Bellini et al., "Assessment of induction machines rotor fault severity by different approaches," 31st Annual Conference of IEEE in Industrial Electronics Society, pp. 1461-1466, 2005.

Bellini et al., "Thorough Understanding and Experimental Validation of Current Sideband Components in Induction Machines Rotor Monitoring," 32nd Annual Conference of IEEE in Industrial Electronics, pp. 4957-4962, 2006.

Cho et al., "Detection of broken rotor bars in induction motors using state and parameter estimation," IEEE Transactions on Industry Applications, vol. 28, No. 3, pp. 702-709, May/Jun. 1992.

Bachir et al., "Diagnosis by parameter estimation of stator and rotor faults occurring in induction machines," IEEE Transactions on Industrial Electronics, vol. 53, No. 3, pp. 963-973, Jun. 2006.

Mirafzal et al., "Induction machine broken-bar fault diagnosis using the rotor magnetic field space-vector orientation," IEEE Transactions on Industry Applications, vol. 40, No. 2, pp. 534-542, Mar./Apr. 2004.

Mirafzal et al., "Effects of load magnitude on diagnosing broken bar faults in induction motors using the pendulous oscillation of the rotor magnetic field orientation," IEEE Transactions on Industry Applications, vol. 41, No. 3, pp. 771-783, May/Jun. 2005.

Antonino-Daviu et al., "Validation of a new method for the diagnosis of rotor bar failures via wavelet transform in industrial induction machines," IEEE Transactions on Industry Applications, vol. 42, No. 4, pp. 990-996, Jul./Aug. 2006.

Supangat et al., "Detection of broken rotor bars in induction motor using starting-current analysis and effects of loading," IEE Proceedings—Electric Power Applications, vol. 153, No. 6, pp. 848-855, Nov. 2006.

Ordaz-Moreno et al., "Automatic Online Diagnosis Algorithm for Broken-Bar Detection on Induction Motors Based on Discrete Wavelet Transform for FPGA Implementation," IEEE Transactions on Industrial Electronics, vol. 55, No. 5, pp. 2193-2202, May 2008.

Riera-Guasp et al., "The Use of the Wavelet Approximation Signal as a Tool for the Diagnosis of Rotor Bar Failures," IEEE Transactions on Industry Applications, vol. 44, No. 3, pp. 716-726, May/Jun. 2008.

Milimonfared et al., "A novel approach for broken-rotor-bar detection in cage induction motors," IEEE Transactions on Industry Applications, vol. 35, No. 5, pp. 1000-1006, Sep./Oct. 1999.

Penman et al., "Condition monitoring of electrical drives," IEE Proceedings—Electric Power Applications, vol. 133, Pt. B, No. 3, pp. 142-148, May 1986.

Muller et al., "A novel method to detect broken rotor bars in squirrel cage induction motors when interbar currents are present," IEEE Transaction on Energy Conversion, vol. 18, No. 1, pp. 71-79, Mar. 2003.

Bellini et al., "Closed-loop control impact on the diagnosis of induction motors faults," IEEE Transactions on Industry Applications, vol. 36, No. 5, pp. 1318-1329, Sep./Oct. 2000.

Briz et al., "Online diagnostics in inverter-fed induction machines using high-frequency signal injection," IEEE Transactions on Industry Applications, vol. 40, No. 4, pp. 1153-1161, Jul./Aug. 2004.

Concari et al., "Rotor fault detection in closed loop induction motors drives by electric signal analysis," Proceedings of the 2008 International Conference on Electrical Machines, pp. 1-6.

Cruz et al., "A New Model-Based Technique for the Diagnosis of Rotor Faults in RFOC Induction Motor Drives," IEEE Transactions on Industrial Electronics, vol. 55, No. 12, pp. 4218-4228, Dec. 2008.

Stefani et al., "Diagnosis of Induction Machines' Rotor Faults in Time-Varying Conditions," IEEE Transactions on Industrial Electronics, vol. 56, No. 11, pp. 4548-4556, Nov. 2009.

Bossio et al., "Effects of rotor bar and end-ring faults over the signals of a position estimation strategy for induction motors," IEEE Transactions on Industry Applications, vol. 41, No. 4, pp. 1005-1012, Jul./Aug. 2005.

* cited by examiner

SYSTEM AND METHOD FOR DETECTING FAULT IN AN AC MACHINE

BACKGROUND OF THE INVENTION

The present invention relates generally to induction machines and, more particularly, to a system and method for detecting fault in an AC induction machine.

Induction machines are widely used in industry for their cost-efficient and robust nature. Many applications for this "workhorse" of industry are fan and pump industrial applications. For example, in a typical integrated paper mill, low voltage and medium voltage motors may comprise nearly 70% of all driven electrical loads. Due to the prevalence of these motors in industry, it is paramount that the induction motor be reliable. Industry reliability surveys suggest that motor failures typically fall into one of four major categories. Specifically, motor faults typically result from bearing and gearbox failures, stator faults resulting in the opening or shorting of the phase winding, rotor cage failure (e.g., broken rotor bars or end-rings), or air-gap irregularities.

Rotor cage failure is one of the most common failures on medium and high voltage large induction machines. The mechanical performance of the rotor cage decays rapidly due to the high thermal stresses on the rotor cage during motor startup, which can cause thermal expansion and thus mechanical stresses, magnetic stresses caused by electromagnetic forces and unbalanced magnetic pull, dynamic stresses that result from the high rotating torque during operation, environmental stresses due to contamination and abrasion of rotor material, as well as mechanical stresses due to loose laminations, etc. As the mechanical performance of the rotor cage degrades, breakage of the rotor bar or end ring may occur. When rotor cage failure occurs, the performance of the overall motor system largely degrades, often resulting in output torque/speed oscillation, possibly stator/rotor rub, and eventually catastrophic motor system breakdown.

Motor faults not only lead to the repair or replacement of the individual motor, but also cause financial losses due to long lead times for repairs and unexpected process downtime. Furthermore, manually detecting such fault-causing conditions is difficult at best because the motor must be running for detection. As such, an operator usually must remove the motor from operation to perform a maintenance review and diagnosis. However, removing the motor from service is undesirable in many applications because motor down-time can be extremely costly.

In order to avoid such financial losses, detection devices have been designed that generate feedback regarding an operating motor. The feedback is then reviewed by an operator to determine the operating conditions of the motor. However, most systems that monitor operating motors merely provide feedback of faults that have likely already damaged the motor. As such, though operational feedback is sent to the operator, it is often too late for preventive action to be taken.

Some systems have attempted to provide an operator with early fault warning feedback for detecting rotor cage failure using vibration analysis, temperature sensing, and thermal imaging. For example, vibration monitoring has been utilized to provide some early misalignment or unbalance-based faults. However, when a mechanical resonance occurs, machine vibrations are amplified. Due to this amplification, false positives indicating severe mechanical asymmetry are possible. Furthermore, vibration-based monitoring systems typically require highly invasive and specialized monitoring systems to be deployed within the motor system.

In light of the drawbacks of vibration-based monitoring, current-based monitoring techniques have been developed to provide a more inexpensive, non-intrusive technique for detecting faults. For example, the signature frequency component in the stator current spectra has been monitored. If an increase in the signature frequency component is detected, a rotor bar failure is believed to occur. However, the reliability of these techniques is often poor for several reasons. First, the change in the signature frequency component may be caused by reasons unrelated to rotor cage failure. Also, motor failure cannot be detected when no baseline information is available indicating a healthy operation condition.

To improve the reliability of rotor cage failure detection techniques, some methods aim to evaluate fault severity. These methods effectively remove the need to know the initial machine baseline and improve the robustness of the overall fault detection. However, existing fault severity evaluation techniques are only accurate when applied to machines operated under a full load condition. Further, machine monitoring is primarily focused on protection instead of fault prediction.

As faults may develop when a machine is not operating under a full load condition, it would be desirable to design a system and method for detecting rotor cage failure in a machine operating at less than full load at an early stage with high reliability. Further, it would be desirable to design a system and method capable of predicting a rotor fault.

BRIEF DESCRIPTION OF THE INVENTION

The present invention provides a system and method for detecting faults in AC induction machines.

In accordance with one aspect of the invention, a controller is configured to detect a rotor fault condition. The controller includes a processor programmed to receive voltage and current data from an AC induction machine, generate a current frequency spectrum from the current data, and identify rotor-fault related harmonics in the current frequency spectrum. The processor is also programmed to calculate a fault severity indicator using the voltage and current data, identified rotor-fault related harmonics, and motor specifications, analyze the fault severity indicator to determine a possibility of rotor fault, and generate an alert based on the possibility of rotor fault.

In accordance with another aspect of the invention, a method is provided for detecting a rotor fault in an induction machine. The method includes the steps of accessing current and voltage data during operation of an AC induction machine, performing a frequency spectrum analysis on the current data to generate a current frequency spectrum, and generating a plurality of fault index samples from the current frequency spectrum over a period of operation of the AC induction machine. The method also includes the steps of determining a rotor fault probability based on the plurality of fault index samples and outputting a rotor fault indicator based on the determined rotor fault probability.

In accordance with yet another aspect of the invention, a computer readable storage medium has stored thereon a computer program. The computer program includes instructions which, when executed by at least one processor, cause the at least one processor to receive a plurality of voltage and current measurements from a sensor system coupled to an AC induction motor and analyze the plurality of current measurements to identify rotor fault harmonics therein. The instructions also cause the at least one processor to calculate a plurality of fault severity indices based on the rotor fault harmonics and define a fault severity indicator from the plurality of fault severity indices. Further, the instructions cause the at least one processor to compare the fault severity indicator to a predetermined fault severity threshold and output a fault possibility based on the comparison of the fault severity indicator to the predetermined fault severity threshold.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE INVENTION

Several embodiments of the invention are set forth that relate to a system and method of detecting a rotor cage fault in an AC induction machine. The system monitors current and voltage and performs a current analysis to generate a fault index indicative of the severity of a rotor fault condition.

Figure 1:
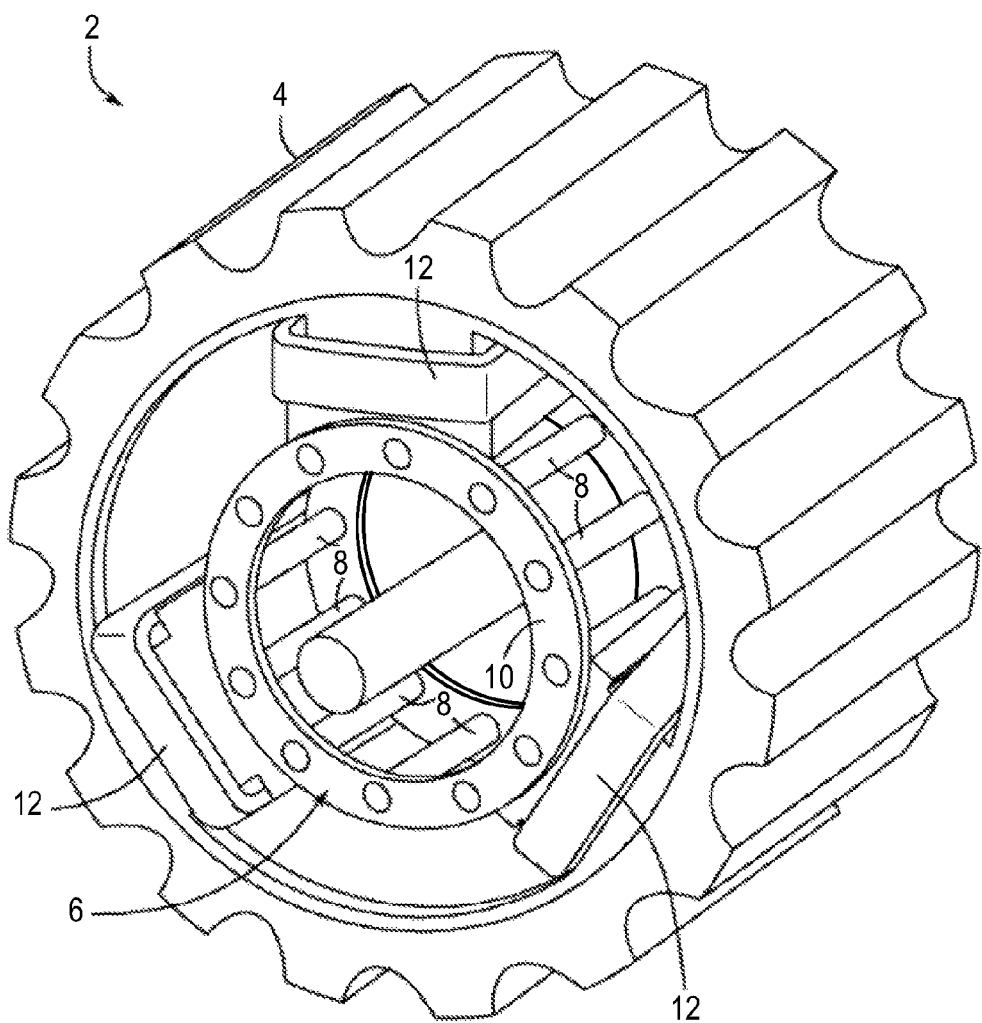
FIG. 1 is a simplified illustration of an AC induction machine according to an embodiment of the invention.

FIG. 1 illustrates an AC induction machine 2 comprising a stator 4 and a rotor cage assembly 6. AC induction machine 2 may be a motor or generator, according to various embodiments of the invention. Rotor assembly 6 includes a number of rotor bars 8 coupled to an end-ring 10. In operation, current flows through stator windings 12 creating a magnetic field that induces current flow through rotor bars 8. When a rotor failure occurs, such as a broken rotor bar or broken end-ring, current cannot flow through the broken rotor component, which results in an unbalanced rotor flux. The unbalanced rotor flux, along with speed and torque oscillation caused by the broken rotor component, induces specific frequency harmonics in the stator current spectrum. Accordingly, the fault severity of a rotor cage fault may be determined by evaluating the stator current spectra.

Figure 2:
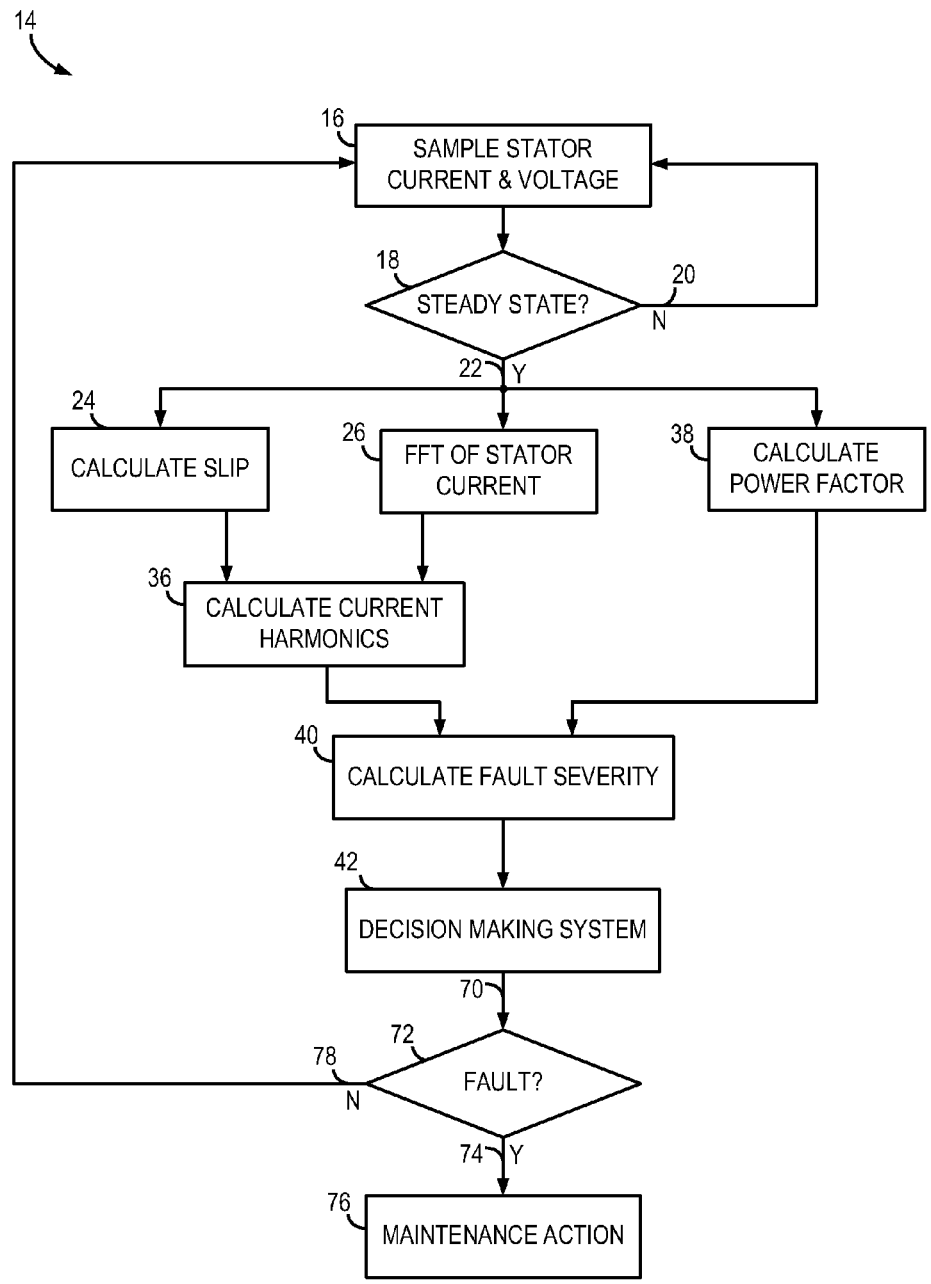
FIG. 2 is a technique for detecting a rotor fault in an induction machine according to an embodiment of the invention.

Referring now to FIG. 2, a technique 14 is shown for detecting a rotor fault or failure in an AC induction motor, such as, for example, AC induction machine 2 (FIG. 1). Technique 14 begins at step 16 by sampling stator current and line-line voltage data using current and voltage sensors, such as, for example, sensors described below with respect to FIG. 7. Based on the stator current and voltage measurements, technique 14 determines whether the motor is operating at steady state at step 18. If the motor is not at steady state 20, technique 14 cycles back to step 16 and continues to sample the stator current and voltage. If the motor is at steady state 22, technique 14 determines the motor slip, s, at step 24. Motor slip, s, may be calculated using the measured rotor speed or may be estimated based on motor voltage and current monitoring, according to various embodiments. At step 26, technique 14 performs an FFT analysis of the stator current data to determine the frequency spectrum of the stator current.

Figure 3:
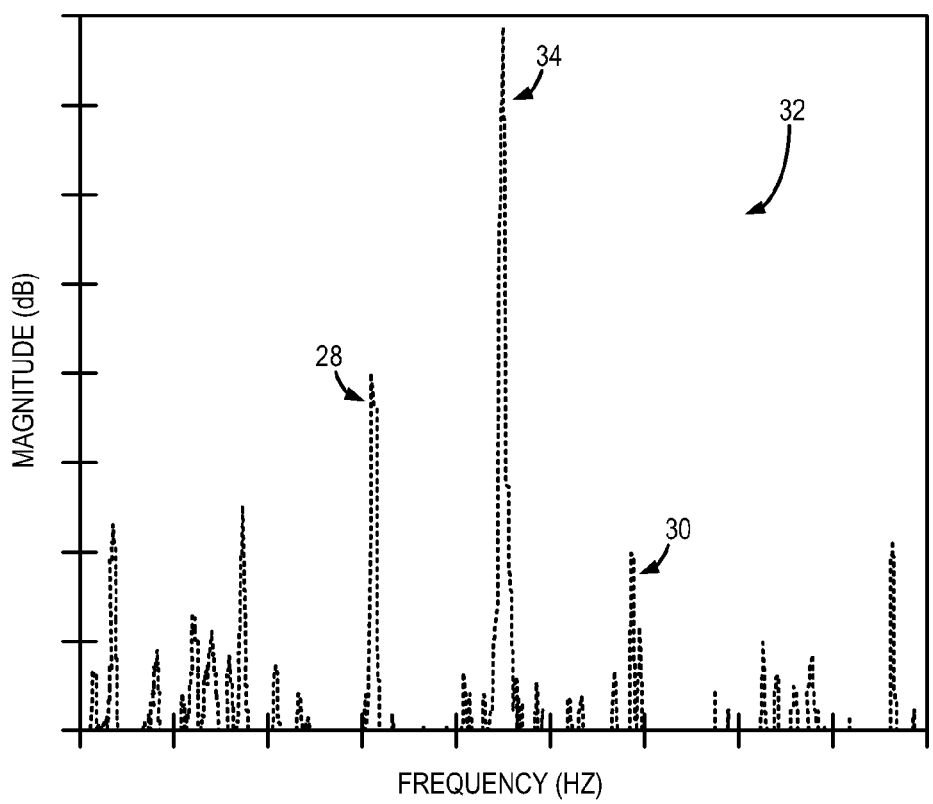
FIG. 3 is an exemplary graph illustrating a stator current frequency spectrum.

Using the motor slip and stator current frequency spectrum, technique 14 can evaluate the existence and magnitude of a rotor fault. As shown in FIG. 3, a rotor cage failure may be said to induce harmonics 28, 30 in the stator current spectra 32 at frequencies $$f_b = (1 \pm 2s)f \qquad \text{Eqn. 1,}$$

where $f_b$ is the frequency of the current related to a rotor fault, s is the motor slip, and f is the fundamental frequency 34 of the power supply. Using Eqn. 1, technique 14 calculates a pair of rotor fault-related current harmonics at step 36.

At step 38, technique 14 calculates a power factor, PF, using the sampled current and voltage data as follows:

$$PF = \cos \phi \qquad \text{Eqn. 2,}$$

where $\phi$ is the power factor angle at fundamental frequency.

The current harmonics and power factor calculated at steps 36, 38 are used to calculate a fault severity at step 40 as follows $$\text{fault severity} = \frac{\left| I_{s,(1-2s)f} + \left| I_{s,(1+2s)f} \right| \cdot \left| \frac{1}{3} \cos \varphi + j \sin \varphi \right| \cdot e^{j\varphi} \right|}{\left| I_{s,f} - I_{s0,f} \cdot e^{j(\varphi - 90°)} \right|} \cdot N_r, \qquad \text{Eqn. 3}$$

where $N_r$ is the number of rotor bars, $I_{s,(1+2s)f}$ is the magnitude of the stator current at the upper fault-related current harmonic, $I_{s,(1-2s)f}$ is the magnitude of the stator current at the lower fault-related current harmonic, $I_{s,f}$ is the magnitude of the stator current at fundamental frequency, and $I_{s0,f}$ is the magnitude of the stator current at fundamental frequency when the motor is operated under a no-load condition with the load disconnected. According to various embodiments, $I_{s0,f}$ may be measured by performing a no-load test or may be estimated as a certain percentage (e.g., 20-40%) of the rated motor current or full-load current. For simplicity, Eqn. 4 may be used to calculate fault severity for a motor operated under a relatively high load condition (e.g., higher than 50% of the rated load) according to $$\text{fault severity} = \frac{\left| I_{s,(1-2s)f} + \left| I_{s,(1+2s)f} \right| \cdot e^{j\varphi} \right|}{\left| I_{s,f} - I_{s0,f} \cdot e^{j(\varphi - 90°)} \right|} \cdot N_r. \qquad \text{Eqn. 4}$$

Based on the calculated fault severity, technique 14 initiates a decision-making system at step 42 to determine if a rotor bar failure or fault exists. Because the fault severity is calculated over time, error in the current and voltage measurements induces noise in the calculated fault severity.

According to one embodiment, the decision-making scheme applies an adaptive filtering technique to the calculated fault severity data to reduce the chances of a false alarm and improve the reliability of the overall rotor fault detection scheme. The adaptive filter uses an advanced averaging technique that inputs variances in the calculated fault severity index to the filter. The adaptive filtering is carried out according to:

$$\hat{x}_n = (P_{n-1} + Q) \cdot x_n / (P_{n-1} + Q + 0.01) + \\ 0.01 \cdot \hat{x}_{n-1} / (P_{n-1} + Q + 0.01)$$  Eqn. 5 and $$P_n = \begin{cases} 0.1 & \text{if } |x_n - x_{n-1}| > 0.05 \\ (0.01 \cdot P_{n-1})/(P_{n-1} + Q + 0.01) & \text{else} \end{cases}$$  Eqn. 6 where $x_n$ is the calculated fault severity index at each step, $\hat{x}_n$ is the estimated fault severity index after adaptive filtering, and the initial values are set as $\hat{x}_0 = x_0$ and $P_0 = 0.01$.

Figure 4:
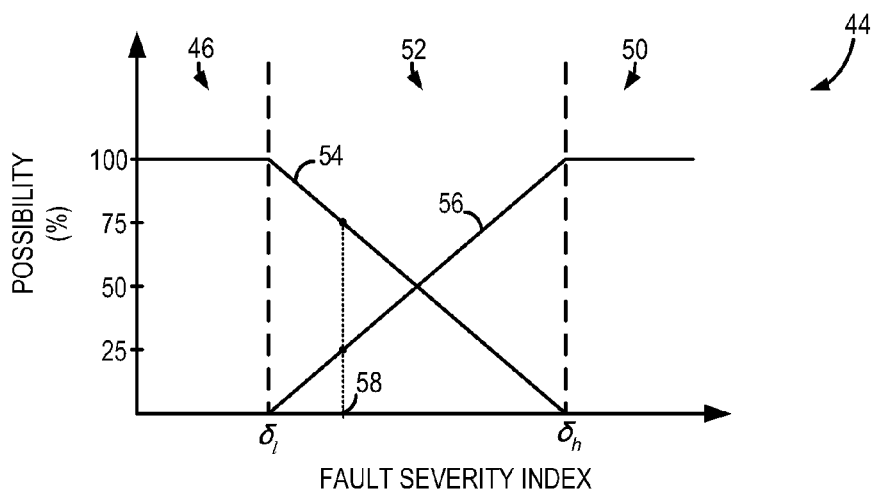
FIG. 4 is a membership function of an exemplary fuzzy system usable with the technique of FIG. 2.

After adaptive filtering, technique 14 applies a fuzzy system for decision-making FIG. 4 illustrates a membership function 44 of the fuzzy system, according to one embodiment of the invention. Membership function 44 is used to identify the possibility of a rotor fault or failure in an induction motor (i.e., a confidence level in the rotor health) based on the fault severity index calculated according to step 40 of technique 14 (FIG. 2). Membership function 44 categorizes the possibility of rotor fault into three regions based on the fault severity index.

Figure 5:
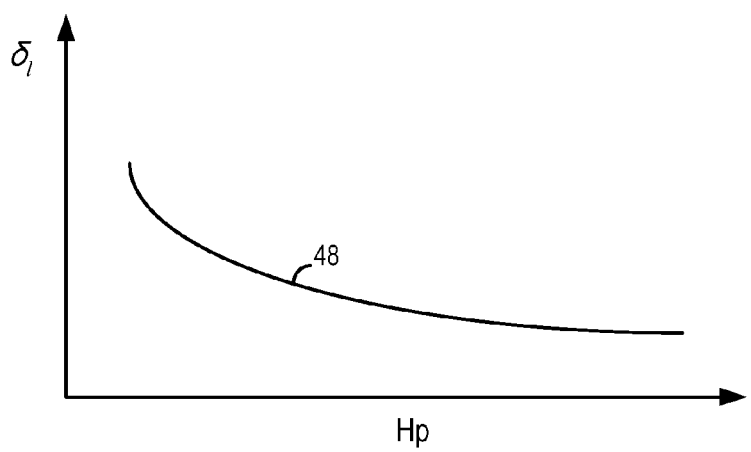
FIG. 5 is an exemplary graph illustrating the relationship between intrinsic rotor unbalance and induction motor size.

A first region 46 represents a healthy induction machine (i.e., no presence of rotor fault or failure). In other words, fault severity indices falling within first region 46 have a 100% confidence level of indicating a healthy machine condition. The upper bound of region 46 is defined based on a maximum expected value of the fault severity index for a healthy induction motor, $\delta_l$, which is mainly caused by intrinsic rotor unbalance. Rotor unbalance varies based on the size of an induction motor, as illustrated in FIG. 5, where curve 48 illustrates a relationship between rotor unbalance and motor horsepower. Typically, for a large, medium- or high-voltage induction motor, the intrinsic rotor unbalance is relatively small as a result of the processes used to manufacture the motor, while small induction motors typically have larger intrinsic rotor unbalance. The intrinsic rotor unbalance in medium-voltage induction motors does not vary largely. Therefore, the selection $\delta_l$ may be defined based on empirical data for a given range of motor sizes. For example, according to one embodiment the relationship between horse power and $\delta_l$ may be defined for a medium-voltage motor (e.g., 2,200 Hp-20,000 Hp) as $$\delta_l \approx \frac{20}{500 + Hp} + 4\%,$$  Eqn. 7 where Hp represents the rated horse power of the induction motor.

Referring again to FIG. 4, a second region 50 of membership function 44 is defined to include fault severity indices that indicate a 100% confidence level in an unhealthy rotor condition. Second region 50 is defined to have a lower bound corresponding to the minimum expected value of the fault severity index when a rotor failure exists, $\delta_h$. Ideally, $\delta_h$ is 100%. However, various factors including magnetic saturation, end-ring resistance, and inductance may impact the calculation of the fault severity index. Therefore, $\delta_h$ is defined according to $$\delta_h \approx k_{saturation} \cdot k_{end\text{-}ring}$$  Eqn. 8, where $k_{saturation}$ is defined based on empirical data. According to one embodiment, $k_{saturation}$ is approximately 35%. $k_{end\text{-}ring}$ is calculated based on motor parameters attainable from the motor datasheet or nameplate information according to $$k_{end\text{-}ring} \approx \frac{10\pi p^2 L}{N_r D_r + 10\pi p^2 L},$$  Eqn. 9 where p is the number of pole pairs, $N_r$ is the total number of rotor bars, $D_r$ is the diameter of the rotor cage, and L is the length of the rotor cage. In practice, $D_r$ may be substituted with the diameter of the stator frame. Likewise, L may be substituted with the length of the stator frame. $\delta_h$ is then determined using a bounded range as follows $$\delta_h \approx \min\left(\delta_l + 20\%, \frac{3.5\pi p^2 L}{N_r D_r + 10\pi p^2 L}\right).$$  Eqn. 10

A third region 52, which is defined between $\delta_l$ and $\delta_h$, represents a "fuzzy zone" wherein each fault severity value has a corresponding low fault possibility 54, indicating a confidence level for a determination that the motor is healthy, and a corresponding high fault possibility 56, indicating a confidence level for a determination that that the motor is unhealthy. For example, membership function 44 indicates a 75% confidence level that fault severity value 58 represents a healthy rotor condition and a 25% confidence level that fault severity value 58 represents an unhealthy rotor condition.

Figure 6:
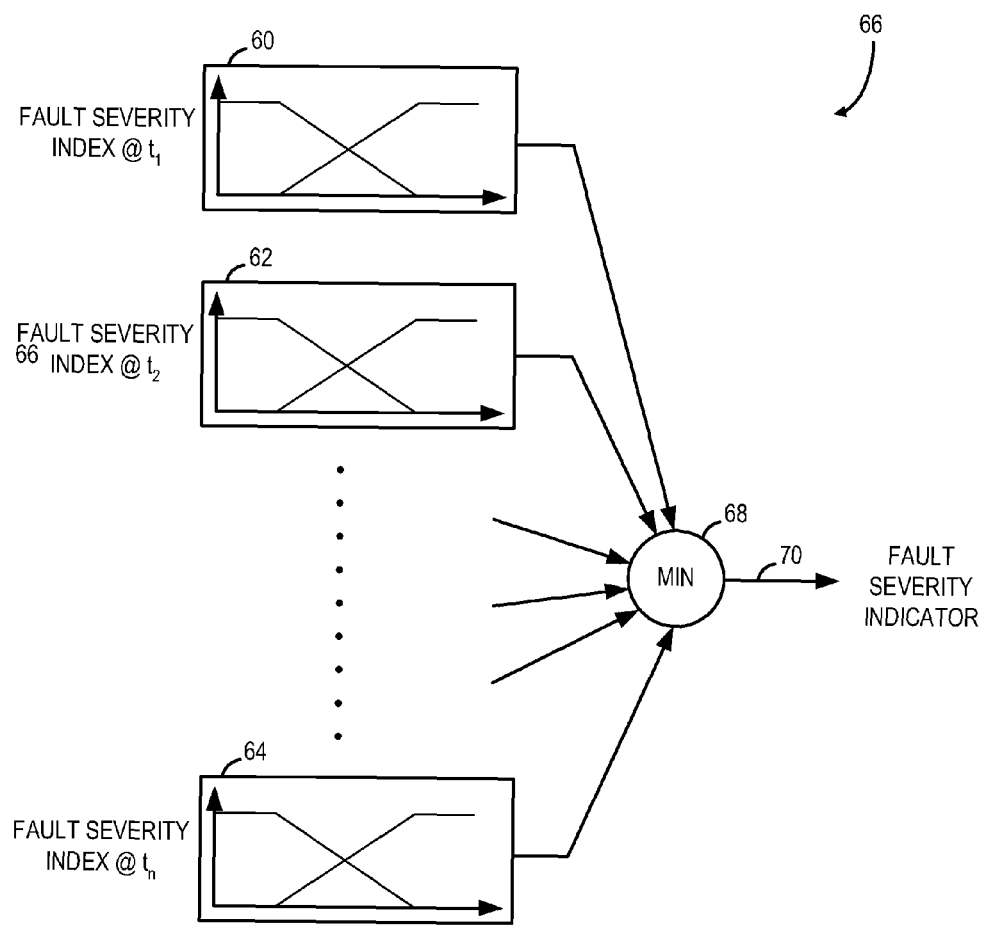
FIG. 6 is a schematic illustrating a fuzzy system usable to calculate a fault possibility according to an embodiment of the invention.

According to one embodiment, a single fault severity index calculated at step 40 of technique 14 (FIG. 2) and input to membership function 44 may be used as a fault severity indicator for rotor fault detection. Alternatively, as illustrated in FIG. 6, a number of fault severity indices 60-64 calculated at times $t_1$, $t_2$, and $t_n$ may be used in a fuzzy decision system 66 in order to improve the reliability of rotor fault detection and minimize the number of false alarms. Fault indices 60-64 are input into a Minimize operation 68, which is carried out according to Eqn. 11 to output a fault severity indicator 70 as Output=min(input$_1$,input$_2$ . . . , input$_n$)  Eqn. 11.

The number of fault severity indices used to determine fault severity indicator 70 in fuzzy decision system 66 may be adjusted depending on the particular motor application. For example, approximately three to seven indices are used to determine a fault severity indicator, according to one embodiment. As one skilled in the art will recognize, a larger number of indices will achieve improved reliability, while a smaller number of indices will yield a quicker response of the motor protection system. Further, fault severity indices may be calculated at pre-determined intervals, such as, for example, hourly, daily, or monthly, according to various embodiments.

Referring again to FIG. 2, technique 14 uses fault severity indicator 70 output from decision making system 42 to determine whether a fault exists at step 72. According to one embodiment, technique 14 compares fault severity indicator 70 to a predetermined threshold and determines a fault exists if fault severity indicator 70 is greater than the threshold. The threshold may be preset by an operator based on a user's application conditions, according to one embodiment. Thus, technique 14 may determine a fault exists if the high fault possibility is greater than 90%, for example. Further, a second threshold (e.g., 80%) may be selected to indicate a warning condition so that the user can schedule a maintenance during the next system outage.

If a fault exists 74, technique 14 generates a fault warning at step 76. For example, technique 14 may generate an audible or visual alarm to alert a user of the identified fault. If a fault does not exist 78, technique 14 cycles back to step 16. According to one embodiment, technique 14 displays the output of step 72 to a user on a display, such as, user interface 106 of FIG. 8. For example, a red light may be illuminated on user interface 106 to indicate a fault, a yellow light may be used to indicate that user inspection of the motor is recommended, and a green light may be displayed to indicate a no-fault or healthy rotor condition.

Figure 7:
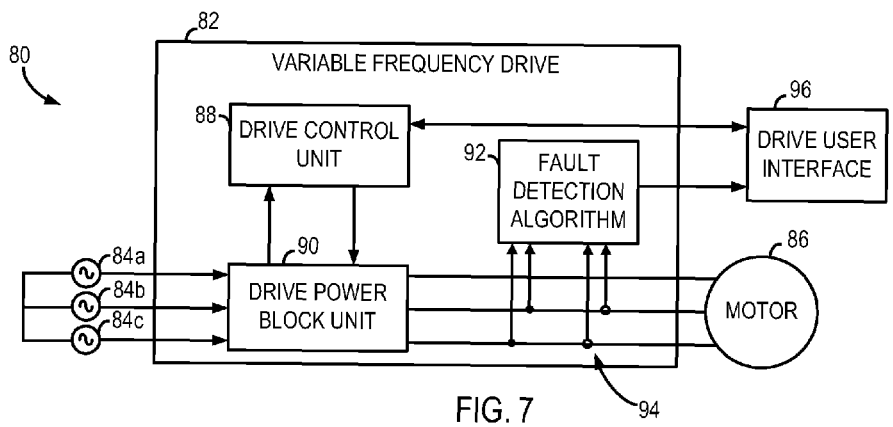
FIG. 7 is a schematic of a motor drive system incorporating a fault detection algorithm according to one aspect of the invention.

According to embodiments of the invention, technique 14 can be implemented in a plurality of systems, such as those shown in FIGS. 7-11. Referring to FIG. 7, a general structure of a motor assembly 80 is shown. Motor assembly 80 includes a motor drive 82, which may be configured, for example, as an adjustable or variable speed drive designed to receive a three-phase AC power input power input 84a-84c and drive a AC induction motor 86, such as, squirrel cage motor 2 of FIG. 1. A drive control unit 88 is integrated within motor drive 82 and functions as part of the internal logic of the drive 82.

Motor drive 82 also includes a drive power block unit 90, which may, for example, containing an uncontrollable or controllable rectification unit (uncontrolled AC to DC), a filtering inductor, a DC bus capacitor or battery, and a pulse width modulation (PWM) inverter (DC to controlled AC). Alternatively, drive power block unit 90 may be provided without such a rectification unit such that the DC bus is directly connected to the inverter. A drive power block unit may be provided without a rectification unit when applied to an uninterruptible power supply (UPS), for example.

Motor assembly 80 includes a fault detection algorithm module 92 that receives current and voltage data from sensors 94 coupled to motor 86. According to one embodiment, fault detection algorithm module 92 is integrated within drive 82 and functions as part of the internal logic of drive 82. Alternatively, fault detection algorithm module 92 may be embodied in an external module distinct from drive 82, and receive data therefrom (e.g., current and voltage signals), as described in more detail with respect to FIGS. 8 and 9.

Motor assembly 80 also includes a drive user interface 96 or drive control panel, configured to input motor parameters and output frequency and voltage references, which are used to produce starting torque to accelerate motor 86 from zero speed. According to one embodiment, user interface 96 is also configured to display a rotor fault indicator to a user for monitoring purposes.

Figure 8:
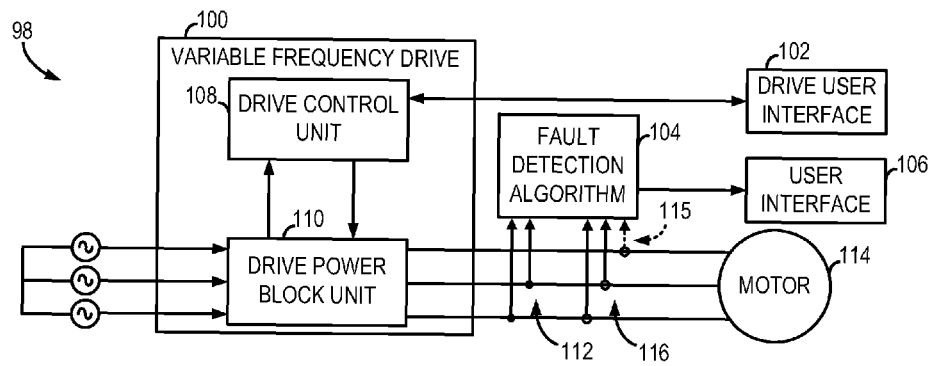
FIG. 8 is a schematic of a motor drive system incorporating a fault detection algorithm according to another aspect of the invention.

Referring now to FIG. 8, a motor assembly 98 is shown according to another embodiment of the invention. Motor assembly 98 includes a variable frequency motor drive 100, a drive user interface 102, and a standalone external fault detection algorithm module 104 that receives voltage and current signals, including single-phase current and voltage signals, multiple-phase current and voltage signals, or combinations thereof, which may be used to determine steady-state operating conditions. A user interface 106 is coupled to standalone external fault detection algorithm module 104. A drive control unit 108 and drive power block unit 110 are included within motor drive 100.

Fault detection algorithm module 104 is a separate hardware module external to the existing hardware of motor drive 100 and may be installed in an existing motor drive and exchange data through existing drive communications, such as, for example, ModBus, Device Net, Ethernet, and the like. Module 104 uses a set of voltage sensors 112 to measure the three phase line-to-line voltages of a motor 114. Module 104 also includes a set of current sensors 116 to measure the three phase currents of motor 114. Where no neutral point is available, module 104 includes at least two current sensors for a three-wire system. As the three phase currents add to zero, the third current may be calculated from the other two current values. However, while a third sensor 117 (shown in phantom) is optional, such sensor increases the accuracy of the overall current calculation.

Figure 9:
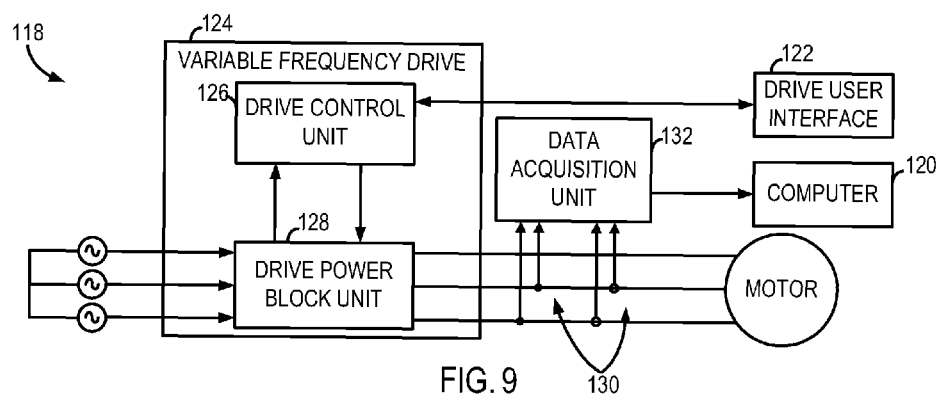
FIG. 9 is a schematic of a motor drive system incorporating a fault detection algorithm according to yet another aspect of the invention.

FIG. 9 illustrates a motor assembly 118 including an external fault detection algorithm module 120 in accordance with another embodiment of the present invention. Similar to the motor assembly described with respect to FIG. 8, motor assembly 118 includes a drive user interface 122 and a variable frequency drive 124 having a drive control unit 126 and a drive power block unit 128. However, unlike the motor assembly of FIG. 8, external module 120 does not have its own voltage and current sensors. Instead, external module 120 is implemented in a computing device that obtains voltage and current signals 130 via a data acquisition unit 132.

Figure 10:
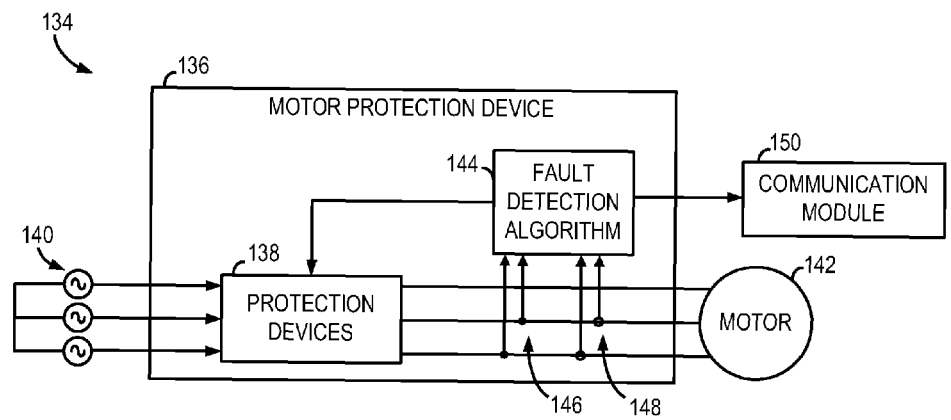
FIG. 10 is a schematic of a motor protection system incorporating a fault detection algorithm according to another aspect of the invention.

Referring now to FIG. 10, a motor protection system 134 is illustrated in accordance with yet another embodiment. System 134 includes a motor protection assembly 136 having at least one motor protection device 138 such as, for example, a contactor assembly having a number of independently controllable contactors configured to selectively control the supply of power from an AC power source 140 to a motor 142. Motor protection assembly 136 also includes a fault detection algorithm module 144 that receives current and voltage data from current and voltage sensors 146, 148. Fault detection algorithm module 144 analyzes the current data to determine the presence of a fault condition in motor 142 and transmits a signal indicative of the fault condition to a communication module 150.

Figure 11:
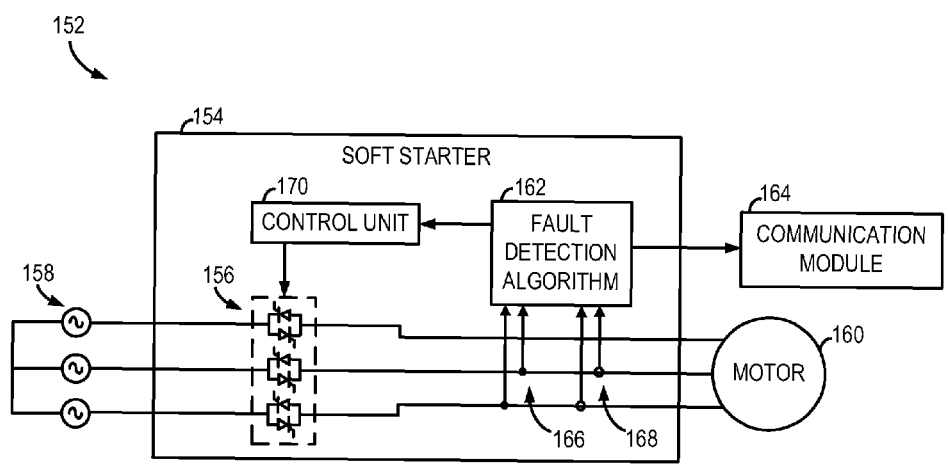
FIG. 11 is a schematic of a motor starter system incorporating a fault detection algorithm according to one aspect of the invention.

According to another embodiment of the present invention, a motor starter system 152 is illustrated in FIG. 11. Motor starter system 152 includes a soft starter 154 having a number of semi-conductor devices 156, such as thyristors and/or diodes, to transmit a supply power between a power source 158 and a motor 160. A fault detection algorithm module 162, similar to fault detection algorithm module 92 of FIG. 7, is included within soft starter 154 and is configured to interface with communication module 164, receive current and voltage information from sensors 166, 168, and transmit signals to control unit 170.

While the embodiments set forth in FIGS. 7-11 are described with respect to a motor, one skilled in the art will readily recognize that such embodiments are equally applicable for use with alternative AC induction machines, such as, for example, a generator.

As described in detail above, embodiments of the invention may be embodied in an internal module that receives a motor current and voltage data or in a stand-alone external module configured to receive voltage and current signals. Further, the above-described methods can be embodied in the form of computer program code containing instructions embodied in one or more tangible computer readable storage media, such as floppy diskettes and other magnetic storage media, CD ROMs and other optical storage media, flash memory and other solid-state storage devices, hard drives, or any other computer-readable storage medium, wherein, when the computer program code is loaded into and executed by a computer, the computer becomes an apparatus for practicing the disclosed method. The above-described methods can also be embodied in the form of a generically termed "controller" configured to detect rotor failure that would include a processor in the form of a fault detection algorithm unit and/or computer shown in the various embodiments of FIGS. 7-11.

A technical contribution for the disclosed method and apparatus is that it provides for a controller implemented technique for rotor fault detection in an AC induction machine.

Therefore, according to one embodiment of the present invention, a controller is configured to detect a rotor fault condition. The controller includes a processor programmed to receive voltage and current data from an AC induction machine, generate a current frequency spectrum from the current data, and identify rotor-fault related harmonics in the current frequency spectrum. The processor is also programmed to calculate a fault severity indicator using the voltage and current data, identified rotor-fault related harmonics, and motor specifications, analyze the fault severity indicator to determine a possibility of rotor fault, and generate an alert based on the possibility of rotor fault.

According to another embodiment of the present invention, a method is provided for detecting a rotor fault in an induction machine. The method includes the steps of accessing current and voltage data during operation of an AC induction machine, performing a frequency spectrum analysis on the current data to generate a current frequency spectrum, and generating a plurality of fault index samples from the current frequency spectrum over a period of operation of the AC induction machine. The method also includes the steps of determining a rotor fault probability based on the plurality of fault index samples and outputting a rotor fault indicator based on the determined rotor fault probability.

According to yet another embodiment of the present invention, a computer readable storage medium has stored thereon a computer program. The computer program includes instructions which, when executed by at least one processor, cause the at least one processor to receive a plurality of voltage and current measurements from a sensor system coupled to an AC induction motor and analyze the plurality of current measurements to identify rotor fault harmonics therein. The instructions also cause the at least one processor to calculate a plurality of fault severity indices based on the rotor fault harmonics and define a fault severity indicator from the plurality of fault severity indices. Further, the instructions cause the at least one processor to compare the fault severity indicator to a predetermined fault severity threshold and output a fault possibility based on the comparison of the fault severity indicator to the predetermined fault severity threshold.

The present invention has been described in terms of preferred embodiments, and it is recognized that equivalents, alternatives, and modifications, aside from those expressly stated, are possible and within the scope of the appending claims.

What is claimed is:

1. A controller configured to detect a rotor fault condition, the controller having a processor programmed to:
   receive voltage and current data from an AC induction machine;
   generate a current frequency spectrum from the current data;
   identify rotor-fault related harmonics in the current frequency spectrum;
   calculate a fault severity indicator using the voltage and current data, identified rotor-fault related harmonics, and motor specifications;
   analyze the fault severity indicator to determine a possibility of rotor fault; and
   generate an alert based on the possibility of rotor fault.

2. The controller of claim 1 wherein the processor is programmed to identify a lower rotor-fault related harmonic and an upper rotor-fault related harmonic in the current frequency spectrum.

3. The controller of claim 1 wherein the processor is programmed to calculate the fault severity indicator using motor nameplate information, motor size, and a number of rotor bars in the AC induction machine.

4. The controller of claim 1 wherein the processor is programmed to analyze the fault severity indicator using a fuzzy decision-making system.

5. The controller of claim 4 wherein the processor is programmed to:
   identify a maximum expected fault severity for a healthy machine;
   identify a minimum expected fault severity for an unhealthy machine; and
   determine the possibility of a rotor fault based on the calculated fault severity indicator, the maximum expected fault severity, and the minimum expected fault severity.

6. The controller of claim 5 wherein the processor is programmed to generate the alert if the possibility of a rotor fault is greater than a threshold.

7. The controller of claim 4 wherein the processor is further programmed to apply an adaptive filter to reduce noise in the calculated fault severity indicator.

8. The controller of claim 4 wherein the processor is further programmed to:
   calculate a plurality of fault severity indices over a period of motor operation; and
   define the fault severity indicator based on the plurality of fault severity indices.

9. The controller of claim 8 wherein the processor is programmed to calculate a given fault severity index using $$\text{fault severity} = \frac{|I_{s,(1-2s)f} + |I_{s,(1+2s)f}| \cdot e^{j\varphi}|}{|I_{s,f} - I_{s0,f} \cdot e^{j(\varphi - 90°)}|} \cdot N_r$$

where $N_r$ is a number of rotor bars in the AC induction machine, $\varphi$ is a power factor angle, $I_{s,(1+2s)f}$ is a current magnitude at the upper fault-related current harmonic, $i_{s,(1-2s)f}$ is a current magnitude at the lower fault-related current harmonic, $I_{s,f}$ is a current magnitude at fundamental frequency, and $I_{s0,f}$ is a current magnitude at fundamental frequency at a no-load operating condition.

10. A method of detecting a rotor fault in an induction machine, the method comprising:
   accessing current and voltage data during operation of an AC induction machine;
   performing a frequency spectrum analysis on the current data to generate a current frequency spectrum;
   generating a plurality of fault index samples from the current frequency spectrum over a period of operation of the AC induction machine;
   determining a rotor fault probability based on the plurality of fault index samples; and
   outputting a rotor fault indicator based on the determined rotor fault probability.

11. The method of claim 10 wherein generating the plurality of fault index samples comprises:
   identifying a pair of fault-related harmonics in the current frequency spectrum;
   determining a current magnitude at each harmonic of the pair of fault-related harmonics;
   determining a current magnitude at fundamental frequency; and
   determining a no-load current magnitude.

12. The method of claim 11 comprising calculating the plurality of fault index samples based on the current magnitudes at the pair of fault-related harmonics, the current magnitude at fundamental frequency, the no-load current magnitude, a number of rotor bars of the AC induction machine, and a power factor of the AC induction machine.

13. The method of claim 10 comprising generating the plurality of fault index samples based on current and voltage data acquired at pre-determined intervals during machine operation.

14. The method of claim 10 further comprising:
   setting a rotor fault probability threshold;
   comparing the determined rotor fault probability to the rotor fault probability threshold; and
   if the determined rotor fault probability is greater than the rotor fault probability threshold, then generating an alarm signal.

15. The method of claim 10 comprising applying fuzzy logic to determine the rotor fault probability.

16. The method of claim 10 wherein outputting the rotor fault indicator comprises displaying an indicator representative of a magnitude of the determined rotor fault probability.

17. A computer readable storage medium having stored thereon a computer program comprising instructions which, when executed by at least one processor, cause the at least one processor to:
   receive a plurality of voltage and current measurements from a sensor system coupled to an AC induction motor;
   analyze the plurality of current measurements to identify rotor fault harmonics therein;
   calculate a plurality of fault severity indices based on the rotor fault harmonics;
   define a fault severity indicator from the plurality of fault severity indices;
   compare the fault severity indicator to a predetermined fault severity threshold; and
   output a fault possibility based on the comparison of the fault severity indicator to the predetermined fault severity threshold.

18. The computer readable storage medium of claim 17 wherein the instructions further cause the at least one processor to generate a fault indicator if the fault possibility is greater than a threshold.

19. The computer readable storage medium of claim 17 wherein the instructions cause the at least one processor to output one of a visual and an audible signal indicating a severity of the fault possibility.

20. The computer readable storage medium of claim 17 wherein the instructions cause the at least one processor to calculate the plurality of fault severity indices based on current magnitudes at the identified rotor fault harmonics, a current magnitude at fundamental frequency, a no-load current magnitude, a number of rotor bars of the AC induction motor, and a power factor of the AC induction motor.

* * * * *